United States Patent [19]

Taguchi et al.

[11] Patent Number: 4,866,007
[45] Date of Patent: Sep. 12, 1989

[54] METHOD FOR PREPARING SINGLE-CRYSTAL ZNSE

[75] Inventors: Tsunemasa Taguchi; Isao Kidoguchi; Hirokuni Nanba, all of Osaka, Japan

[73] Assignees: Sumitomo Electric Industries Co.; Production Engineering Assoc., both of Osaka, Japan

[21] Appl. No.: 169,688

[22] Filed: Mar. 18, 1988

[30] Foreign Application Priority Data

Mar. 18, 1987 [JP] Japan .................................. 62-65389

[51] Int. Cl.⁴ .............................................. C30B 1/12
[52] U.S. Cl. .................................... 437/108; 156/603; 156/DIG. 72; 156/DIG. 77; 423/509; 75/65 ZM; 437/247
[58] Field of Search .......................... 437/108, 247; 156/DIG. 72, DIG. 77, 603; 423/509; 75/65 ZM

[56] References Cited

U.S. PATENT DOCUMENTS

| 3,146,204 | 8/1964 | Aven | 156/DIG. 72 |
| 3,939,035 | 2/1976 | Keller | 156/603 |
| 3,957,954 | 5/1976 | Gault | 423/509 |
| 4,258,009 | 3/1981 | De Leon et al. | 75/65 ZM |
| 4,465,546 | 8/1984 | Fitzpatrick et al. | 423/509 |
| 4,584,053 | 4/1986 | Namba et al. | 423/509 |

FOREIGN PATENT DOCUMENTS

| 0132046 | 10/1980 | Japan | 156/603 |
| 0132618 | 2/1985 | Japan | 156/603 |
| 2288106 | 12/1987 | Japan | 423/509 |
| 8402540 | 7/1984 | PCT Int'l Appl. | 156/603 |
| 2090237 | 7/1982 | United Kingdom | 423/509 |

OTHER PUBLICATIONS

Blum et al., "Growing Single Crystals of High Melting, Decomposable Compounds," IBM Tech. Dis. Bulletin, vol. 9, No. 12, May 1967, pp. 1674–1676.

Primary Examiner—Brian E. Hearn
Assistant Examiner—M. Wilczewski
Attorney, Agent, or Firm—Sughrue, Mion, Zinn, Macpeak & Seas

[57] ABSTRACT

A method for preparing single-crystal ZnSe comprising the steps of:
working polycrystalline ZnSe into a rod-shaped starting material;
placing the starting material in a reaction vessel;
filling the atmosphere of the reaction vessel with an inert gas, nitrogen, $H_2Se$ gas, or a mixture thereof at from about 0.1 to about 100 Torr; and
converting the polycrystalline ZnSe starting material to single-crystal ZnSe, while maintaining a solid phase, by moving the reaction vessel at a rate of from about 0.05 to about 5 mm/day through a temperature profile consisting of a cool zone AB having a temperature $T_1$ in the range of from about room temperature to about 100° C., a temperature increasing zone BC having a temperature gradient of from about 50° to about 200° C./cm, a hot zone CD having a temperature $T_2$ in the range of from about 700° to about 900° C., a temperature decreasing zone DE having a temperature gradient of from about $-200$° to about $-50$° C./cm, and a cool zone EF having a temperature $T_1$ in the range of from about room temperature to about 100° C.

26 Claims, 5 Drawing Sheets

METHOD FOR PREPARING SINGLE-CRYSTAL ZNSE

FIELD OF THE INVENTION

The present invention relates to a method of single-crystal growth of ZnSe in bulk form.

BACKGROUND OF THE INVENTION

ZnSe is one of the II-VI compound semiconductors which find extensive use as component materials of optical elements because their band gap ranges widely from 3.5 eV for ZnS to 0.1 eV for CdHgTe. In particular, ZnSe has a great potential for practical use as a material for making LEDs that emit light in the blue region of the spectrum. Light-emitting diodes (LED) capable of light emission in the infrared region or in the red, orange, yellow and green regions have also been fabricated and used commercially in high volumes. However, blue light emitting LEDs have not yet reached a commercial stage, chiefly because of the scarcity of suitable materials.

General considerations that are taken into account in selecting suitable materials for LEDs are as follows:

(i) direct-gap semiconductors are desirable;
(ii) ease of p-n junction formation;
(iii) ease of obtaining a large-area substrate crystal; and
(iv) simple device process.

Besides these considerations, materials suitable for making LEDs that emit in the blue region must satisfy the additional requirement that they have a band gap of 2.5 eV or more.

Several semiconductor materials are known to meet these conditions and they include GaN, SiC, ZnSe, ZnS, GaAlN, and ZnSSe. However, all of these materials are still at the laboratory stage and no commercially important materials have yet been attained.

In the absence of a good quality GaN substrate, it has been proposed that a GaN LED be fabricated by heteroepitaxial growth of n-GaN and i-GaN on a sapphire substrate. Because of the hetero-epitaxy involved, however, this product suffers the disadvantage that cracks are prone to develop in the crystalline layers due to thermal expansion mismatch and, therefore, that the product deteriorates rapidly. A further defect is that the i-layer is difficult to control in such a way as to avoid fluctuations in the operating voltage.

Although an SiC LED uses an indirect-gap semiconductor and is unable to emit light with high efficiency, bulk crystals of SiC are known and can be used as the substrate of the device. Since the crystal growth involved is homo-epitaxy, no problems occur due to the difference between lattice constants. Notwithstanding these advantages, it is difficult to prepare a SiC substrate of good quality, and manufacture of SiC LEDs is far from being at a commercial stage.

ZnSe is a direct-gap semiconductor having a band gap (Eg) of 2.7 eV, but it has the disadvantage that only an n-type crystal can be produced. After many years of failure to produce p-type crystals of ZnSe, a report has recently been published that announces a successful growth of p-ZnSe by doping with Li. This direction represents the future of ZnSe LEDs (J. Nishizawa et al., "Blue light emission from ZnSe p-n junctions", *J. Appl. Phys.*, Vol. 57, No. 6, pp. 2210–2216 (1985)).

The usual practice of making an LED from ZnSe involves hetero-epitaxy of ZnSe on a GaAs substrate because a ZnSe substrate of good quality is difficult to produce. On the other hand, a GaAs substrate of good quality is available, and a ZnSe epitaxial layer can be grown on this substrate by a conventional technique such as molecular-beam epitaxy or pyrolysis of organic metals. Of course, ZnSe layers are better grown by homo-epitaxy in order to attain a desirable lattice match. To obtain an epitaxially grown layer of good quality, the ZnSe substrate on which it is grown must also be of good quality. In addition, for performing a wafer process in an efficient way, it is strongly desired to prepare a large-area single-crystal ZnSe wafer. However, it is difficult, even using state of the art techniques, to prepare ZnSe single crystals of good quality.

While many crystal-growth methods have been attempted, they have not met with success in producing large single crystals of ZnSe in high yields and with few defects.

One reason for the difficulty involved i making single crystals of II-VI compounds is that these materials will not melt unless a high pressure is applied. As for Zn compounds, the melting point increases in the order of ZnTe, ZnSe and ZnS, with a corresponding increase in pressure required to melt these compounds.

In the case of ZnSe, inert gas pressures in the range of from twenty to thirty or the like to 50 atm must be applied, and a temperature as high as 1,520° C. is required in order to melt ZnSe without causing its sublimation.

The liquid encapsulated Czochralski (LEC) method has been known to be effective in growing single crystals of III-V compound semiconductors in bulk form. In this technique, the melt is covered with a layer of $B_2O_3$ and a high inert gas pressure applied to prevent sublimation of a group V element. However, this method is not applicable to II-VI compound semiconductors since the liquid encapsulant will react with the starting materials to be melted.

The inability to use the LEC method is another reason why it is extremely difficult to grow large single crystals of II-VI compound semiconductors in bulk form. As alternatives, the high-pressure Bridgman method, the sublimation method, the iodine transport method, and the solution growth method have been attempted with a view toward growing single crystals of ZnSe, but they all have proved unsatisfactory in one or more aspects including electrical properties, crystallinity, purity, crystallographic shape, size, and crystal growth rate of the resulting crystals.

An overview of the previous attempts at growing single crystals of II-VI compound semiconductors is given hereinafter. For outlines of the conventional growth techniques for II-VI compound semiconductors, see the following references:

*Kessho Koqaku Handbook* (Crystal Optics Handbook), pp. 699–702 (1971), Kyoritsu Shuppan; Tankessho Sakuseiho (Preparation of Single Crystals), edited by the Physical Society of Japan, pp. 121–149 (1966), Asakura Shoten; Akasaki et al, "Aoiro LED no Shorai Tenbo (Future Aspect on Blue Light-Emitting Diode)", *Journal of the Institute of Electronics and Communication Engineers of Japan*, vol. 69, No. 5, pp. 487–491 (1986).

(A) High-pressure Bridgman Method

FIG. 4 is a schematic diagram of a typical apparatus used in the high-pressure Bridgman method. The method performs crystal growth from a melt and has the advantage that a large single crystal can be easily grown. However, in the case of II-VI semiconductors, this method involves considerable technical difficulties because of the need to use extremely high temperatures and pressures.

A long vertical rotating crucible 24 having a tapered lower end is charged with a starting ZnSe material which is pressurized with an argon gas 26 to approximately 50 atm while it is melted with a heater 28. The region having a flat temperature profile is used as the liquid 30 from which a crystal is to be grown, with a temperature decreasing portion being formed in the lower part. As the rotating crucible is allowed to descend, the liquid in the tapered section starts to solidify. Although the growing crystal has various crystallographic orientations, one having a certain orientation will grow in predominance over crystals having other orientations, with the result that a single crystal will form as the crucible is passed through the low-temperature zone, first the tapered section, then the flared part, and finally the body of the crucible.

A large-diameter crystal can be formed by the high-pressure Bridgman method, but the resulting crystal contains many defects. Furthermore, the crystal obtained is not necessarily a single crystal.

An alternative technique employing melting at high pressure is the Tammann method in which rather than allowing the crucible to descend, the power of a heater is controlled such that the temperature of the melt is lowered while maintaining a certain temperature gradient.

As with the Bridgman method, a ZnSe single crystal can be drawn from the melt by the Tamman method, but the crystal contains many defects and also sometimes fails to be a purely single crystal.

A common problem to the Bridgman and Tammann methods is that because of the high temperatures employed, ingress of impurities such as Si and C is very likely to occur and single crystals of high purity are difficult to attain.

(B) Solution Growth Method

The principle of the solution growth method is that ZnSe is dissolved in a solution of a solvent such as Bi, Sn, In, Se—As or Se—As—Sb to form a saturated ZnSe solution. The solution is either cooled or provided with a temperature difference such that a desired crystal will form on the cool side.

Nishizawa et al. studied a method of effecting crystallization at 1,050° C. from polycrystalline ZnSe dissolved in a solvent (Zn or Se), with the vapor pressure of Zn or Se being properly controlled. As a result, they found that a stoichiometric ZnSe crystal could be grown by this method. They also showed that this method was capable of forming a p-type ZnSe single crystal (Nishizawa et al., *J. Appl. Phys.*, Vol. 57, No. 6, pp. 2210–2216 (1985)). However, this method which involves crystallization from solution is only capable of producing small single crystals with diverse shapes that defy exact shape control.

(C) Sublimation Method

The II-VI compounds have very high sublimation pressures. The sublimation method advantageously uses this fact in which a starting material is allowed to sublime and a desired crystal is formed in the cool zone by diffusion.

FIG. 5 is a schematic diagram of a typical apparatus used in the sublimation method. A quartz ampule in closed tube form is placed horizontally and heated with a heater in such a way that a starting ZnSe material 34 in portion is heated at 1,015° C. and solid Se or Zn 36 in portion b is held at about 500° C. so as to keep the vapor pressure of Se or Zn at equilibrium. The portion c of the ampule is heated at 1,000° C. Sublimation of ZnSe at portion a is expressed by the following reaction scheme:

$$ZnSe \rightarrow Zn + \tfrac{1}{2}Se_2$$

The resulting gas is cooled at portion to form crystalline ZnSe 32. The portion c is either fitted with a seed crystal or made in a conical form so that the random formation of crystalline nuclei will be prevented to ensure the production of a mass of single crystal.

The major disadvantage of the sublimation method is that its success largely depends on growth conditions and that a polycrystalline form rather than a single crystal of high quality is more likely to occur under certain conditions.

(D) Piper and Polich Method

A modification of the sublimation method that effects sublimation in an Ar gas atmosphere was developed by Piper and Polich. This modified method is called the Piper and Polich method after the names of the inventors.

FIG. 6 is a schematic representation of the apparatus used in the Piper and Polich method.

A sintered ZnSe charge 38 is packed in a long horizontal container. Argon gas 40 is introduced into the container at a pressure of about 1 atm and the container is inserted into a heater 44 having a triangular temperature profile. As the container is moved to the right in FIG. 6, ZnSe is heated to sublime.

The sintered ZnSe charged is heated to sublime as it passes through the zone having a temperature gradient XY. The vapor moves toward the tip of the container where it is crystallized. As a result, a space is formed between the crystal and the sintered material which has a lower density than the crystal. When the container has completed its rightward movement (referring to FIG. 6), a single crystal of ZnSe is left behind in the container. The temperature at point Y is 1,360° C. The temperature gradient of a zone YZ is 20° C./cm or less. For details of the Piper and Polich method, see their article entitled "Vapor-Phase Growth of Single Crystals of II-VI Compounds", *J. Appl. Phys.* Vol. 32, 1278–1279 (1961). It should be noted here that in the Piper and Polich method, the ZnSe charged is sintered by packing ZnSe powder. This method also has the disadvantage in that its success largely depends on growth conditions and that a polycrystalline form rather than a single crystal of high quality is more likely to be produced under certain conditions.

(E) Halogen Transport Method

The principle of this method is to grow a single crystal 42 by using halogens such as $I_2$ and $Cl_2$ as a transporting agent. When $I_2$ is used, this method is called the iodine transport method.

FIG. 7 shows a typical apparatus used in the iodine transport method. A vertical growth container is charged with a ZnSe powder. The "powder" is actually a sinter prepared by filling an evacuated quartz ampule with a prebaked (900° C.) commercially available ZnSe powder of high purity and firing the same at 1,000° C. for at least 48 hours. This treatment is effective in removing impurities and increasing the diameter of ZnSe particles.

A mixture of the ZnSe powder and iodine is placed in the growth container. The top of the container is closed with a quartz rod that is fitted with a seed crystal 46 of ZnSe on its underside.

The lower part of the container is heated to a higher temperature (850° C.) than the part where the seed crystal is attached (840° C.). The reversible reaction given below describes the process:

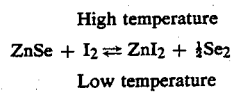

High temperature
$$ZnSe + I_2 \rightleftarrows ZnI_2 + \tfrac{1}{2}Se_2$$
Low temperature As shown, $ZnSe+I_2$ and $Se_2$ are generated at the high-temperature end (bottom) of the container and are transported upward to reach the cool end where crystallization 48 of the ZnSe occurs. The iodine then diffuses back to the charge and recommences the transport cycle. The ZnSe will not sublime vigorously at temperatures on the order of 850° C., so it is transported with the aid of $I_2$.

The evacuated container is sealed off without using argon, so it is filled with an iodine atmosphere.

The maximum temperature employed in this method is 850° C., with the temperature gradient being on the order of 20° C./cm. Under these conditions, the free movement of $ZnI_2$ and $Se_2$ occurs.

Depending on growth conditions, this method often results in the formation of polycrystalline form, rather than a single crystal. This method also suffers the disadvantage of a very slow growth rate.

(F) CVD Process

The principle of the CVD process is to react the Zn vapor with $H_2Se$ gas and to allow ZnSe to be deposited on a substrate after it has formed as a result of the following reaction:

$$H_2Se \text{ (gas)} + Zn \text{ (vapor)} \rightleftarrows ZnSe \text{ (solid)} + H_2 \text{ (gas)}$$

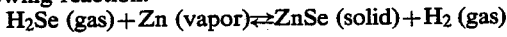

The CVD process can be implemented by several methods.

FIG. 8 shows an apparatus used in one technique of the CVD process. The system consists of a zinc evaporating furnace and a reactor furnace which are placed in one vessel.

The zinc evaporating furnace 11 has a heater 12 that heats the zinc in a zinc container 13 to a molten state 14. Argon is introduced into the evaporator 11. The argon serves as a carrier gas that transports the Zn vapor toward the reactor 15. Also introduced into the reactor 15 is $H_2Se$ gas.

The reactor 15 is equipped with a heater 16 that heats a substrate 17 to an appropriate crystallization temperature. In a region where the substrate is heated at the crystallization temperature, $H_2Se$ reacts with the Zn gas to form ZnSe which is deposited on the substrate 17. The unreacted gas is discharged from the reactor 15, with the synthesized ZnSe crystal left behind on the substrate 17. This product, however, is polycrystalline and it is extremely difficult to attain a single crystal of ZnSe by the CVD process.

In another approach, the CVD process can be practiced by using $ZnCl_2$ in place of molten zinc with argon used as a carrier gas. Hydrogen can also be used as a carrier gas.

The substrate 17 is about 1 m long and may be in the form of a rectangular prism of several centimeters per side. With such a large-area substrate, a thin but large-size polycrystalline ZnSe film can be deposited.

Unlike the other methods described above, the CVD process is unable to permit single-crystal growth. The ZnSe polycrystalline produced by the CVD process finds utility as a window defining member and a lens material in a $CO_2$ laser since it offers high transmittance of infrared light.

(G) Travelling Heater Method (THM)

The THM is one of the techniques for crystal growth which have been known in the art for many years as described, e.g., in *Jpn. J. Appl. Phys.*, Vo. 17, 1331 (1978); *J. Cryst. Growth*, Vol. 45, 204 (1978); ibid., Vol. 28, 29 (1975); and *J. Electrochem. Soc.*, Vol. 110, 1150 (1963). In the THM, a heater is moved with respect to a specimen so as to obtain a single crystal while the impurities in the specimen are segregated. Although the THM can operate easily and stably, the THM includes problems in which an extremely high purity is difficult to obtain since a solvent metal is generally used, and a strict temperature control is required since crystal defects are formed by fluctuation of the temperature.

As the foregoing overview of the previous methods shows, many efforts have been made to prepare single-crystal ZnSe through various techniques of crystal growth. However, none of the techniques proposed so far are capable of efficient growth of large single-crystal ZnSe that has very few defects and which is of extremely high purity. These known techniques including the Bridgman, Tammann, and Piper and Polich methods are not capable of effectively preventing ingress of impurities such as Si, Al and C, and hence single crystals of high purity are unattainable. Besides this purity problem, the conventional methods that require high temperatures have a common problem in that the crystals they produce have many defects. Those which permit crystal growth at low temperatures are disadvantageous in that the crystals they produce have low purity and are too small in size.

SUMMARY OF THE INVENTION

It is, therefore, an object of the present invention is to provide a process by which a single crystal of ZnSe that has very few defects and large dimensions can be produced with a high degree of reproducibility and in an efficient manner.

Other objects of the present invention will be apparent from the following description.

The above objects of the present invention can be attained by a method for preparing single-crystal ZnSe comprising the steps of:

working polycrystalline ZnSe into a rod-shaped starting material;

placing the starting material in a reaction vessle;

filling the atmosphere of the reaction vessel with an inert gas, nitrogen, $H_2Se$ gas, or a mixture thereof at from about 0.1 to about 100 Torr; and converting the polycrystalline ZnSe starting material to single-crystal ZnSe, while maintaining a solid phase by moving the reaction vessel at a rate of from about 0.05 to about 5 mm/day through a temperature profile consisting of a cool zone AB having a temperature $T_1$ in the range of from about room temperature to about 100° C., a temperature increasing zone BC having a temperature gradient of from 50 to 200° C./cm, a hot zone CD having a temperature $T_2$ in the range of from about 700 to about 900° C., a temperature decreasing zone DE having a temperature gradient of from about $-200$ to about $-50°$ C./cm, and a cool zone EF having a temperature in the range of from about room temperature to about 100° C.

DETAILED DESCRIPTION OF THE INVENTION

The method of growing single-crystal ZnSe according to the present invention significantly differs from any of the previously attempted techniques for single crystal preparation.

The method of growing single-crystal ZnSe according to the present invention starts with polycrystalline ZnSe that is synthesized by a CVD process or prepared by sintering. The starting material is charged into a reaction vessel, preferably having a tublar configuration (hereinafter sometimes referred to as a "reaction tube"), for example, a quartz ampule together with an inert gas such as argon, nitrogen, $H_2Se$ gas, or a mixture thereof at a pressure of from about 0.1 to about 100 Torr, preferably from 1 to 10 Torr. The reaction tube is then sealed off. A desired ZnSe single crystal is prepared by zone annealing in a triangular temperature profile having a preferred maximum temperature of about 860° C. and a steep temperature gradient of about 100° C./cm. The most preferred annealing rate is about 2 mm/day.

The crystal growth process of the present invention is hereinafter described in detail with reference to the accompanying drawings.

Figure 1:
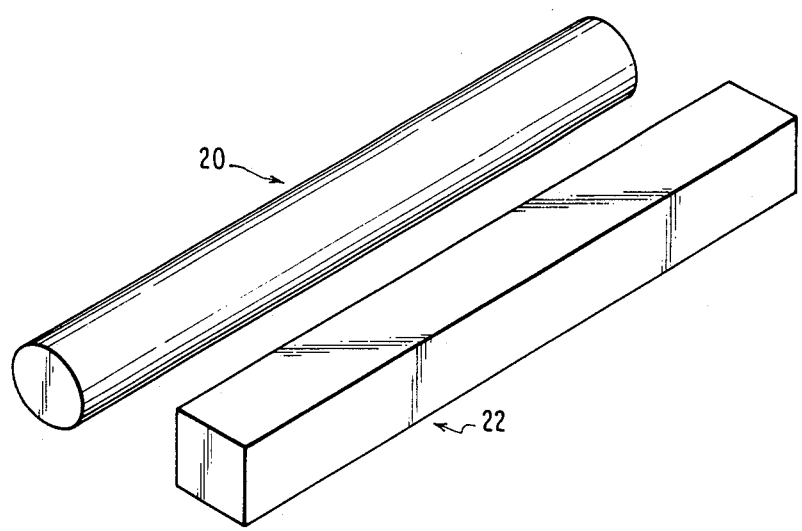
FIG. 1 is a perspective view of a polycrystalline ZnSe sample that is used as a starting material in producing single-crystal ZnSe according to the process of the present invention.

FIG. 1 illustrates polycrystalline ZnSe that is synthesized by a CVD process and which is cut to a rectangular prism 22 (5×5×50 mm) or a cylindrical form 20 (8 mm$\phi$×50 mm). While there is no particular limitation on its shape and size, the polycrystalline ZnSe specimen used as the starting material in the process of the present invention preferably is of a long rod-like shape that can be charged into a reaction vessel, such as a quartz ampule.

The rod-shaped polycrystalline ZnSe is charged into a reaction tube, such as a quartz capsule, together with an inert gas such as argon, nitrogen, $H_2Se$ gas, or a mixture thereof. The argon is introduced at a pressure of from about 0.1 to about 100 Torr. The charged polycrystalline ZnSe does not occupy the entire interior space of the quartz capsule. Since the capacity of the quartz capsule is greater than the volume of the polycrystalline ZnSe, an empty space is left in the capsule.

Figure 2A:
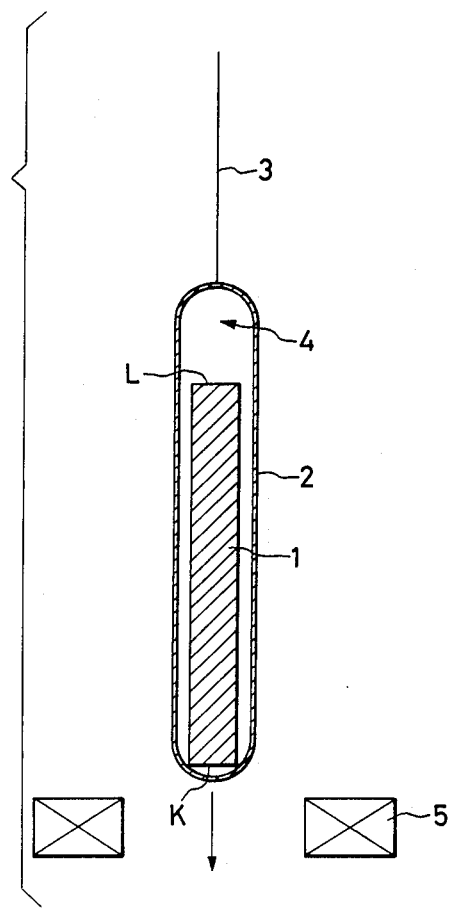
FIG. 2a is a schematic diagram of a system used to effect zone annealing according to the present invention.

The quartz capsule is then subjected to zone annealing as shown in FIG. 2(a). The polycrystalline ZnSe 1 is set in the capsule 2, the interior of which is filled with an argon atmosphere 4 at from about 0.1 to about 100 Torr. The capsule 2 is vertically suspended with a suspender 3.

The polycrystalline ZnSe 1 is heated, from bottom to top, with a heater 5. The heater 5 effects local heating of the polycrystalline material 1. The heater 5 provides a temperature profile of the shape shown in FIG. 2(b), in which the x-axis plots the temperature and the y-axis indicates the position in the vertical direction. In the upper region AB, room temperature $T_1$ is prevalent and a rapid increase in temperature occurs in the region BC. In this specification, the phrase "room temperature" is inclusive of higher temperatures than would normally be considered as ambient temperature, i.e., uptoabout 100° C. The temperature gradient in the region BC is as steep as from about 50° to about 200° C./cm. If resistance heating is employed with a short length of BC, it is particularly difficult to create a steep temperature gradient. Less difficulty is involved i producing a desired temperature gradient with an induction heater. In consideration of these facts, the temperature gradient in the region BC is limited to the range of from about 50 to about 200° C./cm. The best results are attained if the temperature gradient is on the order of 100° C./cm.

In the region CD, a high temperature $T_2$ is maintained. The value of $T_2$ is approximately in the range of from about 700° to about 900° C., with preferred results being attained at about 860° C. The shorter the length of the flat region CD, the better the results. However, if this region is too short, a steep temperature gradient cannot be produced in region BC or DE. In light of these considerations, the length of CD is preferably from about 5 to about 20 mm. Optimum results can be attained at about 10 mm.

In the process of the present invention, the polycrystalline ZnSe is locally heated in the region CD where the crystal grains are set in motion so as to attain lattice match with the single crystal that has already formed in the lower part. This is another reason why the length of CD is desirably short. If the region CD is longer than about 20 mm, the growth and movement of grain boundaries will not necessarily start in an area that is close to the area where the single crystal has formed. This is not favorable for the purpose of obtaining the desired ZnSe single crystal.

In the present invention, ZnSe is not allowed to sublime in the region CD. Instead, ZnSe is allowed to undergo a transition from the polycrystalline to single-crystal state while retaining a solid state. In the Piper and Polich method, the ZnSe in this region is heated to 1,360° C. in order to cause its sublimation. As a result of sublimation, a space is left in this region. The above statement, however, should not be taken to mean that sublimation will never take place in the region CD. It simply means that unlike the Piper and Polich method which depends on sublimation for transporting the constituent elements, the process of the present invention takes utmost care to minimize the occurrence of sublimation.

Although te quartz capsule is sealed off, it has an empty space left inside, and this will cause material loss upon sublimation, which certainly is undesirable and should be avoided at all cost.

If $T_2$ is 900° C. or more, local sublimation occurs to cause material loss. A further problem is the contamination by unwanted substances in the quartz capsule such as impurities and quartz. In order t avoid these problems, $T_2$ is set to about 900° C. and below.

If $T_2$ is 700° C. or less, recrystallization is prevented and no transition from the polycrystalline to single-crystal state will occur. Of course, some sublimation does occur at temperatures in the range of from about 700° to about 900° C., but this is very mild and the argon pressure is sufficient to inhibit any significant material loss due to sublimation.

In the region DE, a rapid decrease in temperature occurs. The temperature gradient in this region is on the order of from about −50 to about −200° C./cm. Best results can be attained with a temperature gradient of about −100° C./cm.

In the region EF, the atmosphere in the quartz capsule is maintained at room temperature $T_1$, which as defined above, is inclusive of temperatures up to 100° C.

In short, the conditions that must be satisfied by temperature T in the respective regions of the reaction tube are summarized as follows, in which h signifies a positional coordinate with a positive value being taken in the downward direction and T signifies the temperature:

| | |
|---|---|
| Region AB | $T = RT (T_1) dT/dh = 0$ |
| Region BC | $50° C./cm \leq (dT/dh) \leq 200° C./cm$ |
| Region CD | $T = 700$ to $900°$ C. $(T_2)$ |
| Region DE | $-200° C./cm \leq (dT/dh) \leq -50° C./cm$ |
| Region EF | $T = RT (T_1) dT/dh = 0$ |

RT: room temperature as defined above

If the specimen moves downwardly from A to F in the temperature profile, the respective regions of the reaction tube may be referred to as follows AB, cool zone; BC, temperature increasing zone; CD, hot zone; DE, temperature decreasing zone; and EF, cool zone, based on the above-defined temperature ranges for each zone.

In regions AB and EF, room temperature $T_1$ is prevalent but this simply means the absence of intentional heating. So long as the ZnSe specimen is in the quartz capsule, the actual temperature will be in the range of from about room temperature to about 100° C. as a result of heat conduction. Thus, "room temperature" as used in this specification is inclusive of temperatures up to 100° C.

Figure 2B:
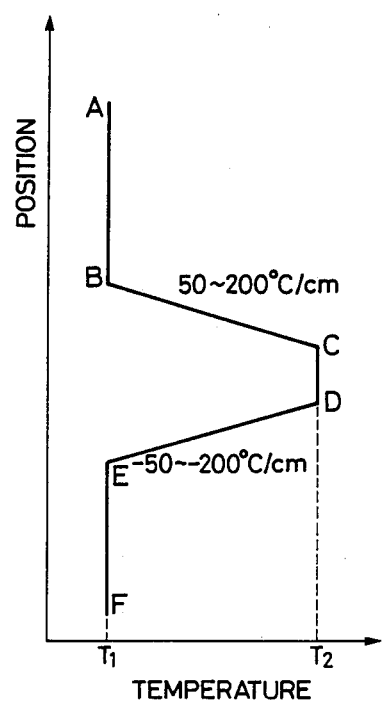
FIG. 2b is the temperature profile of the present invention.
Figure 4:
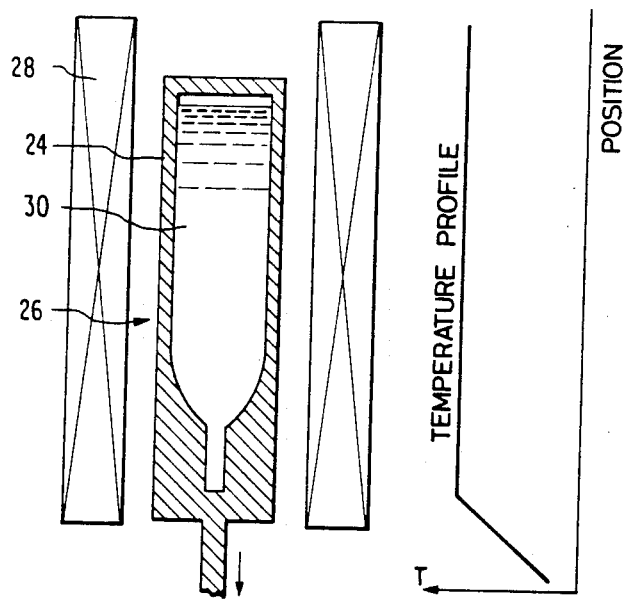
FIG. 4 is a schematic diagram of an apparatus used in the high-pressure Bridgman method.
Figure 5:
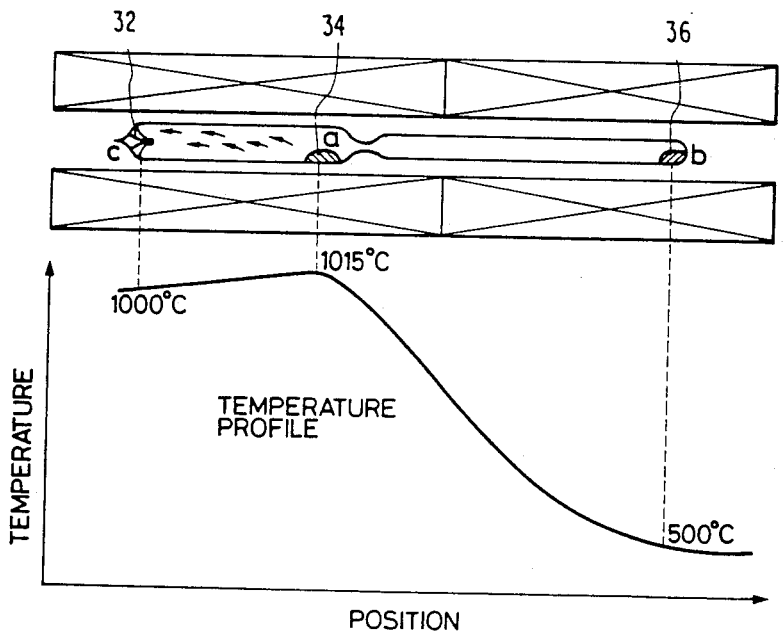
FIG. 5 is a schematic cross section of an apparatus used in the sublimation method.
Figure 6:
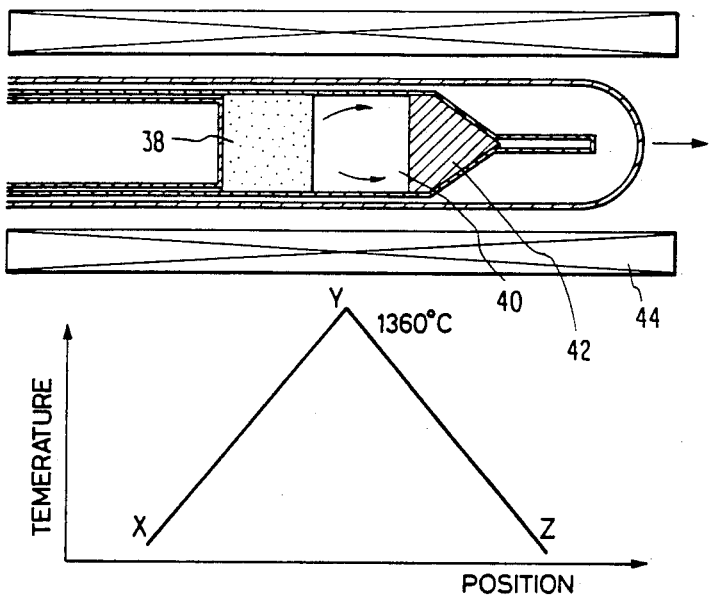
FIG. 6 is a schematic cross section of an apparatus used in the Piper and Polich method.
Figure 7:
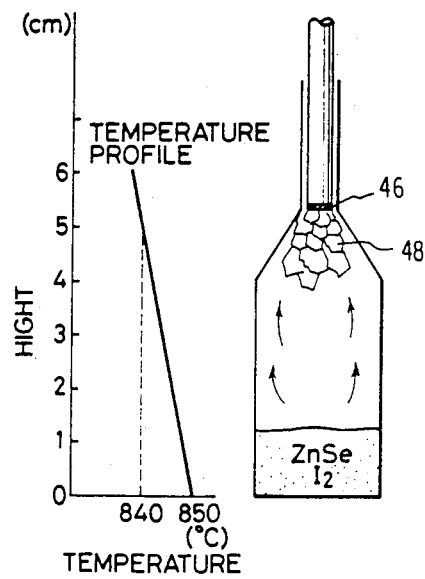
FIG. 7 is a schematic cross section of an apparatus used in the iodine transport method.
Figure 8:
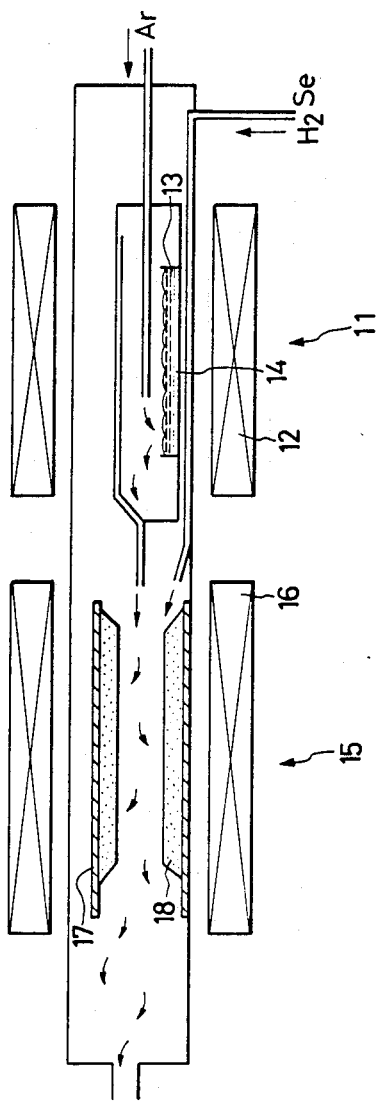
FIG. 8 is a cross-sectional view of an apparatus used to prepare polycrystalline ZnSe by the CVD process.

In FIG. 2(b), the region CD is depicted as being flat. In practice, however, the temperature profile in this region cannot be made flat and instead an upwardly curved profile will result.

Through this temperature profile, the quartz capsule 2 is moved either downwardly or upwardly. Any of the two directions of movement may be selected.

The capsule 2 is moved at a rate (V) of from about 0.05 to about 5 mm/day, with 2 mm/day being particularly preferred. If the ZnSe specimen is 50 mm long, it takes as long as 25 days for the specimen to pass through the region CD, provided that V is 2 mm/day. In actual commercial operation, a much longer period will be required.

The above-described procedure may well be called "zone annealing" since the quartz capsule is heated at the high temperature ($T_2$) of from about 700° to about 900° C. only when it passes through the region CD.

The process of the present invention also falls under the category of a "travelling heater method" (THM) since the heater is moved either upwardly or downwardly with respect to the specimen. The THM is one of the techniques for crystal growth that have been known for many years. However, the process of the present invention is novel and should be distinguished from the THM in that polycrystal-line ZnSe is charged into a capsule together with an inert gas at from about 0.1 to about 100 Torr and that the capsule is passed through the above characterized temperature profile.

After being passed through regions having the steep temperature gradient defined above, the quartz capsule 2 is cut open to recover ZnSe which has been converted into a single-crystal state, except at the end portion of the polycrystalline ZnSe specimen that has been first heated. This end portion of the polycrystalline ZnSe specimen that has been first heated corresponds to its lower end K if the capsule is moved downwardly, and the upper end L if the capsule is moved upwardly, referring to FIG. 2(a).

Whichever end of the specimen this is, the area covered by a few millimeters from the end is polycrystalline and micro-scopic examination shows that grain growth has occurred in that area. Except at this area, all other portions of the polycrystalline specimen has been converted into the single-crystal state. The resulting single crystal ZnSe is slightly yellowish as compared with the starting poly-crystalline material. Since the greater part of the poly-crystalline ZnSe has turned into the single-crystal state, the resulting product is a large ZnSe single crystal capable of being produced in bulk form.

The formation of a polycrystalline form in the area that has been first heated may be explained as follows. When this area is heated, growth of crystal grains will start but these grains have different crystal crystallographic orientations and thus will grow in these respective directions. In the meantime, the grains having a certain orientation and which have grown at the fastest rate will become predominant and crowd out all the others. Subsequently, only these latter grains will grow to form a single crystal.

In the process of the present invention, a seed crystal is not used as the starting material, so it is impossible to predict which orientation the finally obtained single crystal will have. Transition from the polycrystalline to single-crystal state does not introduce any change in the overall shape or size of the crystal. In this respect, the process of the present invention differs markedly from the Piper and Polich method. The formation of a single crystal can be verified by the existence of a distinct cleavage plane (110), and by X-ray diffraction.

The foregoing is the detailed description of the principle of the method for producing single-crystal ZnSe according to the present invention. Additional information about the process is given hereafter.

The polycrystalline ZnSe used as the starting material may be prepared by a CVD process or by sintering. In order to prepare the polycrystalline ZnSe by sintering, a ZnSe powder is hot-pressed at from 600 to 900° C. and at a pressure of from 200 to 300 atm.

The polycrystalline ZnSe is charged in a reaction vessel, preferably having a tublar configuration, which, in the foregoing description, is a quartz capsule. Besides being made of quartz, the reaction vessel or tube may be formed of some other suitable material such as graphite, alumina, or boron nitride (BN).

In the foregoing description, the reaction tube is sealed off but it may be open at one end. In this case, the tube is equipped with a gas inlet and a gas outlet. Even if an open tube is used, the pressure of an inert gas such as argon must be held at from about 0.1 to about 100 Torr.

In the embodiment described above, the temperature profile is created in the vertical direction in such a way that the polycrystalline specimen is moved in the corresponding vertical direction. Alternatively, a horizontal temperature profile may be created, in which case the polycrystalline specimen is placed within a horizontal reaction tube. The specimen is moved horizontally with respect to the heater by moving either member.

The foregoing description assumes the use of argon as an inert gas that fills the atmosphere in the reaction vessel but other inert gases such as Ne or He, nitrogen, $H_2Se$ gas, and a mixture thereof may be employed. If desired, combinations of these gases may be used.

Zone annealing may be performed more than once, if desired. If two or more cycles of zone annealing are run, at least twice as much time is required but this contributes to the production of a single crystal of better quality. Zone annealing can be performed through a plurality of cycles by allowing the polycrystalline specimen to pass through a plurality of heaters arranged side by side. The same result can be attained by moving a single heater back and forth along the reaction tube containing the polycrystalline specimen.

In the method of the present invention, poly-crystalline ZnSe, prepared by a CVD process or sintering is charged in a reaction tube, which is filled with an L inert gas, nitrogen or $H_2Se$ atmosphere at from about 0.1 to about 100 Torr and passed through a local hot zone having temperature $T_2$ (700° to 900° C.). The regions before and after the hot zone have a very steep temperature gradient. During this treatment, the polycrystalline specimen remains unchanged in overall shape and size and retains a solid phase throughout.

On the other hand, the Piper and Polich method employs a high argon pressure of 1 atm (760 Torr). A sintered charge is tightly packed in a closed space and heated at 1,360° C. to sublime. The temperature gradient used in this method is no steeper than 20° C./cm. The method of the present invention differs from the Piper and Polich method in regard to the argon pressure, the temperature in the hot zone, and the temperature gradient. The two methods also differ in terms of the reaction mechanism by which a single crystal is formed from the polycrystalline specimen.

The method of the present invention differs from the high-pressure Bridgman method with respect to the argon pressure (50 to 100 atm in the Bridgman method), temper-ature (at least 1,520° C. in the Bridgman method), tempera-ture profile, and temperature gradient. In the Bridgman method, the melt of a starting material is crystallized. In the method of the present invention, a solid poly-crystalline material is not melted overall and, instead, a single crystal is formed from the polycrystalline material as it retains the solid phase with sublimation thereof held to a minimum level.

The following example is provided for the purpose of further illustrating the present invention but is in no way to be taken as limiting. Unless otherwise indicate,, all parts, percents, ratios, and the like are by weight.

EXAMPLE

A polycrystalline ZnSe prepared by the CVD process was cut to two cylindrical specimens each measuring 7×7×50 mm. The specimens were charged in quartz capsules together with argon and the capsules were sealed off. The argon pressure in one capsule was controlled to be 1 Torr at room temperature, and that in the other capsule was set at 5 Torr.

Each of the capsules was set in a zone annealing apparatus of the type shown in FIG. 2(a). The following temperature conditions were used: $T_1$=room temperature; $T_2$=860° C.; temperature gradient in BC, +100° C./cm; and temperature gradient in DE, −100° C./cm. The quartz capsules were allowed to descend at a rate of 2 mm/day.

The annealed specimens were recovered by cutting the quartz capsules open. The upper part of each specimen was found to have been converted into a single crystal as verified by cleavage and X-ray diffraction.

The polycrystalline portion was cut off to obtain single-crystal specimens each measuring 7×7×20 mm.

Figure 3:
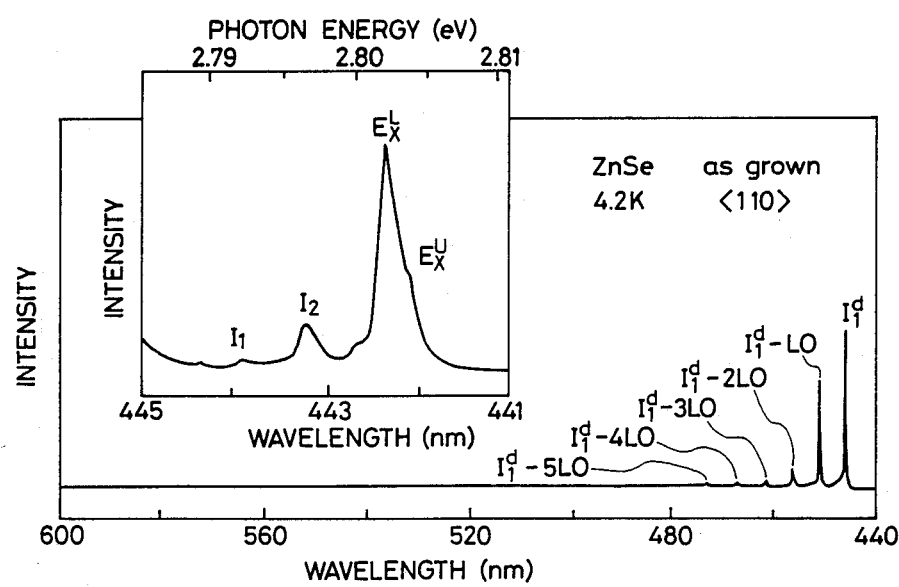
FIG. 3 is a graph showing the results of measurement of photoluminescence at 4.2° K. of single-crystal ZnSe prepared according to the process of the present invention.

Photoluminescence of the two single-crystal specimens was measured at 4.2° K. and the results are shown in FIG. 3, with the wavelength of light (nm) plotted on the x-axis and the luminescence (arbitrary unit) on the y-axis. A He-Cd laser was used as a light source.

The results were substantially the same whether the argon pressure was 1 Torr or 5 Torr, so the description of the results at 5 Torr will suffice.

The specimen was cleaved and etched with 25% aqueous NaOH. The He—Cd laser produced a power of 2 mW at 325 nm and 60 mW at 441.6 nm. The emission from the specimen was detected with a photomultiplier tube (model R943-02 of Hamamatsu Photonics Co., Ltd.). A Jobin-Yvon 1 m single grating monochromator (diffraction grating, 1,200 slits; reverse dispersion, 0.8 nm/mm) was used as a spectroscope. PAR Model 124A was used as a lock-in amplifier.

As FIG. 3 shows, the emission from the specimen has a strong peak of $I_1^d$ at 446 nm on account of an exciton bound to a deep neutral acceptor. The half-width of the $I_1^d$ line is 0.4 meV. This peak is very sharp and does not spread to either side. Such a sharp peak gives an indication of the absence of any perturbation in the exciton binding energy, which is another way of saying that the crystalline structure of the ZnSe single crystal has a minimum degree of lattice distortion.

On the left side of the peak $I_1^d$ is found a replica Of five longitudinal optical (OP) phonons.

The right-hand side of the peak $I_1^d$ appears to be flat but this is not so. An enlarged view of this portion (441 to 445 nm) is shown as an inset in FIG. 3; a large peak Of a free exciton, $E_x^L$, appears at 442.3 nm. The upper branch Of a polariton, $E_x^U$, appears on the right-hand side, or the high-energy side, of $E_x^L$ at 442.1 nm. This is an indication of the high purity of the single crystal.

Peak $I_2$ results from the emission by an exciton bound to a neutral donor impurity. The extremely low level of $I_2$ indicates the substantial absence of donor impurities, which is due to the fact that volatile donor impurities were removed when the moving quartz capsule was subjected to local heating.

Peak $I_1$ results from the emission by an exciton bound to a shallow neutral acceptor. The substantial absence of this peak indicates the existence of very few acceptors at shallow energy levels.

The process of the present invention offers the following advantages.

(1) It is capable of preparing a large ZnSe single crystal.

(2) It is capable of preparing a single crystal of high purity which is substantially free from residual impurities. This is because the process does not employ any solvent as in the solution growth method or any transport agent as in the iodine transport method. The use of a high-purity argon gas prevents the ingress of unwanted impurities, and sublimable donor impurities are removed during zone annealing to achieve satisfactory refining.

(3) In the high-pressure Bridgman method, high temperature and pressure are employed. The process of the present invention which employs neither high temperature nor high pressure ensures the production of a single crystal containing fewer defects.

(4) It achieves consistent and highly reproducible results.

(5) The ZnSe single crystal produced by this process can be used as a substrate for a blue-light emitting LED. An epitaxial layer of good quality can be grown on this substrate. The growth method is homoepitaxy and will not cause the lattice mismatch that is inherent in heteroepitaxial growth of ZnSe on a GaAs substrate.

While the invention has been described in detail and with reference to specific examples thereof, it will be apparent to one skilled in the art that various changes and modifications can be made therein without departing from the spirit and scope thereof.

What is claimed is:

1. A method for preparing single-crystal ZnSe comprising the steps of:

working polycrystalline ZnSe into a rod-shaped starting material;

placing said starting material in a reaction vessel;

filling the atmosphere of said reaction vessel with an inert gas, nitrogen, $H_2Se$ gas, or a mixture thereof at from about 0.1 to about 100 Torr; and converting said polycrystalline ZnSe starting material to single-crystal ZnSe, while maintaining a solid phase, by moving said reaction vessel at a rate of from about 0.05 to about 5 mm/day through a temperature profile consisting of a cool zone AB having a temperature $T_1$ in the range of from about room temperature to about 100° C., a temperature increasing zone BC having a temperature gradient of from about 50° to about 200° C./cm, a hot zone CD having a temperature $T_2$ in the range of from about 700° to about 900° C., a temperature decreasing zone DE having a temperature gradient of from about −200 to about −50° C./cm, and a cool zone EF having a temperature $T_1$ in the range of from about room temperature to about 100° C.

2. A method for preparing single-crystal ZnSe as claimed in claim 1, wherein said polycrystalline ZnSe is prepared by a CVD process.

3. A method for preparing single-crystal ZnSe as claimed in claim 1, wherein said polycrystalline ZnSe is prepared by sintering.

4. A method for preparing single-crystal ZnSe as claimed in claim 1, wherein said inert gas is argon.

5. A method for preparing single-crystal ZnSe as claimed in claim 1, wherein said inert gas is helium or a gaseous mixture of helium and argon.

6. A method for preparing single-crystal ZnSe as claimed in claim 1, wherein said inert gas is neon or a gaseous mixture of neon and argon.

7. A method for preparing single-crystal ZnSe as claimed in claim 1, wherein said atmosphere of said reaction vessel is filled with a gaseous mixture of argon as said inert gas and $H_2Se$.

8. A method for preparing single-crystal ZnSe as claimed in claim 1, wherein said atmosphere of said reaction vessel is filled with a gaseous mixture of nitrogen and $H_2Se$.

9. A method for preparing single-crystal ZnSe as claimed in claim 1, wherein said temperature profile is formed in the vertical direction and said reaction vessel containing said polycrystalline ZnSe is moved either upwardly or downwardly.

10. A method for preparing single-crystal ZnSe as claimed in claim 1, wherein said temperature profile is formed in the horizontal direction and said reaction vessel containing said polycrystalline ZnSe is moved from left to right or right to left.

11. A method for preparing single-crystal ZnSe as claimed in claim 1, wherein said reaction vessel comprises a tublar configuration.

12. A method for preparing single-crystal ZnSe as claimed in claim 11, wherein said reaction vessel is a quartz tube.

13. A method for preparing single-crystal ZnSe as claimed in claim 11, wherein said reaction vessel is made of graphite.

14. A method for preparing single-crystal ZnSe as claimed in claim 11, wherein said reaction vessel is made of alumina.

15. A method for preparing single-crystal ZnSe as claimed in claim 11, wherein said reaction vessel is made of boron nitride.

16. A method for preparing single-crystal ZnSe as claimed in claim 11, wherein said reaction vessel is sealed off and is closed at both ends.

17. A method for preparing single-crystal ZnSe as claimed in claim 1, wherein said reaction vessel is not sealed off and is equipped with a gas inlet and a gas outlet.

18. A method for preparing single-crystal ZnSe as claimed in claim 1, wherein said atmosphere of said reaction vessel has a pressure of from 1 to 10 Torr.

19. A method for preparing single-crystal ZnSe as claimed in claim 1, wherein said temperature increasing zone BC has a temperature gradient of about 100° C./cm, and said temperature decreasing zone DE has a temperature gradient of about −100° C./cm, and said hot zone CD has a temperature of about 860° C.

20. A method for preparing single-crystal ZnSe as claimed in claim 1, wherein said hot zone CD has a length of from about 5 to about 20 mm.

21. A method for preparing single-crystal ZnSe as claimed in claim 20, wherein said hot zone CD has a length of about 10 mm.

22. A method for preparing single-crystal ZnSe as claimed in claim 1, wherein said moving rate is about 2 mm/day.

23. A method for preparing single-crystal ZnSe as claimed in claim 1, further comprising conducting said moving step more than once.

24. A method for preparing single-crystal ZnSe as claimed in claim 23, wherein said inert gas is argon.

25. A method for preparing single-crystal ZnSe as claimed in claim 23, wherein said inert gas is helium or a gaseous mixture of helium and argon.

26. A method for preparing single-crystal ZnSe as claimed in claim 23, wherein said atmosphere of said reaction vessel has a pressure of from 1 to 10 Torr.

* * * * *